(12) United States Patent
Dougherty et al.

(10) Patent No.: US 8,053,251 B2
(45) Date of Patent: Nov. 8, 2011

(54) TEMPERATURE-COMPENSATED FERROELECTRIC CAPACITOR DEVICE, AND ITS FABRICATION

(75) Inventors: T. Kirk Dougherty, Playa del Rey, CA (US); John J. Drab, Santa Barbara, CA (US)

(73) Assignee: Raytheon Company, Waltham, MA (US)

( * ) Notice: Subject to any disclaimer, the term of this patent is extended or adjusted under 35 U.S.C. 154(b) by 904 days.

(21) Appl. No.: 11/207,925

(22) Filed: Aug. 19, 2005

(65) Prior Publication Data

US 2006/0189003 A1    Aug. 24, 2006

(51) Int. Cl.
*H01L 21/00*    (2006.01)
(52) U.S. Cl. .............. 438/3; 257/E21.664; 257/E21.009
(58) Field of Classification Search .............. 438/3, 393, 438/396; 257/295, 296, E21.663, E21.664, 257/E21.009; 361/274.1, 313, 321.2
See application file for complete search history.

(56) References Cited

U.S. PATENT DOCUMENTS

| | | | |
|---|---|---|---|
| 4,195,326 A * | 3/1980 | Ruegg et al. ................. 361/274.1 |
| 4,396,721 A * | 8/1983 | Lawless ............................ 501/10 |
| 4,853,893 A | 8/1989 | Eaton, Jr. et al. |
| 4,868,711 A * | 9/1989 | Hirama et al. ............... 361/321.3 |
| 4,873,610 A * | 10/1989 | Shimizu et al. ................ 361/313 |
| 5,005,102 A | 4/1991 | Larson |
| 5,206,788 A * | 4/1993 | Larson et al. .................. 361/313 |
| 5,218,512 A * | 6/1993 | Nakamura .................. 361/321.1 |
| 5,471,364 A * | 11/1995 | Summerfelt et al. ...... 361/321.4 |
| 5,487,030 A | 1/1996 | Drab et al. |
| 5,552,355 A * | 9/1996 | Cava et al. ..................... 501/137 |
| 5,572,052 A * | 11/1996 | Kashihara et al. ............ 257/295 |
| 5,615,145 A * | 3/1997 | Takeuchi et al. .............. 365/145 |
| 5,638,252 A | 6/1997 | Drab et al. |
| 5,689,456 A * | 11/1997 | Kobayashi .................... 365/145 |
| 5,721,009 A | 2/1998 | Dougherty et al. |
| 5,729,488 A | 3/1998 | Drab et al. |
| 5,781,404 A * | 7/1998 | Summerfelt et al. ....... 361/321.5 |
| 5,784,310 A | 7/1998 | Cuchiaro et al. |
| 5,877,977 A * | 3/1999 | Essaian ......................... 365/145 |
| 5,885,648 A | 3/1999 | Dougherty et al. |
| 5,889,299 A * | 3/1999 | Abe et al. ...................... 257/295 |
| 5,908,658 A | 6/1999 | Dougherty et al. |
| 5,966,318 A | 10/1999 | Ramer et al. |
| 6,340,621 B1 * | 1/2002 | Anderson et al. ............ 438/396 |

(Continued)

FOREIGN PATENT DOCUMENTS

JP        03252160 A * 11/1991

OTHER PUBLICATIONS

Philpy, Stephen C., Ferroelectric Memory Technology for Aerospace Applications, Dec. 31 1999, IEEE pp. 377-383.*

(Continued)

*Primary Examiner* — Matthew Landau
*Assistant Examiner* — Latanya N Crawford
(74) *Attorney, Agent, or Firm* — Baker Botts L.L.P.

(57) ABSTRACT

A temperature-compensated capacitor device has ferroelectric properties and includes a ferroelectric capacitor using a ferroelectric material such as a metal oxide ferroelectric material, a negative-temperature-variable capacitor using a negative-temperature-coefficient-of-capacitance material such as a metal oxide paraelectric material, and an electrical series connection between the negative-temperature-variable capacitor and the ferroelectric capacitor. The temperature-compensated capacitor device may be formed as an integrated layered structure, or as separate capacitors with a discrete electrical connection therebetween.

22 Claims, 4 Drawing Sheets

U.S. PATENT DOCUMENTS

| | | | |
|---|---|---|---|
| 6,605,515 B2* | 8/2003 | Kitagawa et al. | 438/393 |
| 6,680,499 B2* | 1/2004 | Kumura et al. | 257/295 |
| 6,747,334 B2* | 6/2004 | Kitagawa et al. | 257/532 |
| 2001/0015448 A1* | 8/2001 | Kawakubo et al. | 257/296 |
| 2002/0143201 A1* | 10/2002 | Woo | 556/54 |
| 2002/0154533 A1* | 10/2002 | Matsushita | 365/145 |
| 2003/0107072 A1* | 6/2003 | Fujimori | 257/296 |

OTHER PUBLICATIONS

Philpy, (Ferroelectric Mamory Technology for Aerospace Applications, Dec. 31, 1999 IEEE, pp. 377-383).*

* cited by examiner

TEMPERATURE-COMPENSATED FERROELECTRIC CAPACITOR DEVICE, AND ITS FABRICATION

This invention relates to ferroelectric capacitors and, more particularly, to a ferroelectric capacitor device which is temperature compensated to reduce its variation of ferroelectric properties with temperature.

BACKGROUND OF THE INVENTION

Ferroelectric materials are used in a variety of applications. One such application is a ferroelectric capacitor used in a nonvolatile, random access memory whose information is retained even after a power loss. A ferroelectric material is one whose physical state changes upon the application of an electrical field, in a manner analogous with the change undergone by ferromagnetic materials to which a magnetic field is applied. A memory cell may be constructed based upon the hysteresis effects associated with the physical state change. The ferroelectric material has the advantages that its physical state is controlled by the application of a voltage rather than a magnetic field, a measurable state is retained after a power loss, and small-size memory elements may be constructed by microelectronics fabrication techniques, resulting in memory elements that consume little power.

One difficulty with using ferroelectric materials in some applications of interest, such as ferroelectric nonvolatile memory, is that some of the material properties such as permittivity change substantially over relatively narrow temperature ranges. These properties change so greatly, in some cases more than 100 percent over a temperature range of less than 100° C., that the associate read/write electronics can be quite difficult to design and implement.

Ferroelectric materials such as barium titanate, strontium titanate, calcium titanate, calcium stannate, and calcium zirconate are also used to produce discrete ceramic capacitors. For the discrete capacitor application, the material composition is varied to provide a relatively high permittivity over a specified temperature range. While these devices are optimized to provide a relatively constant capacitance value over a specified temperature range, they are not useful to nonvolatile memory applications due to their lack of a remnant polarization component which can be used for information storage.

There exists a need for an improved approach to the design of electronic circuits that utilize ferroelectric properties, to reduce the effects of temperature variations. The present invention fulfills this need, and further provides related advantages.

SUMMARY OF THE INVENTION

The present invention provides a temperature-compensated capacitor device having ferroelectric properties, but in which the ferroelectric properties of the capacitor device have a reduced dependence upon the ambient temperature. The temperature compensation is built into the temperature-compensated capacitor device, and does not require the use of separate compensation devices. It may be fabricated with a relatively minor modification to the fabrication procedure.

In accordance with the invention, a temperature-compensated capacitor device having ferroelectric properties comprises a ferroelectric capacitor comprising a ferroelectric material, a negative-temperature-variable capacitor comprising a negative-temperature-coefficient-of-capacitance material, and an electrical series interconnection between the negative-temperature-variable capacitor and the ferroelectric capacitor. The negative-temperature-coefficient-of-capacitance material, and thence the negative-temperature-variable capacitor, exhibits decreased capacitance with increasing temperature over an operational temperature range.

The electrical series connection may comprise a direct physical contact between the ferroelectric capacitor and the negative-temperature-variable capacitor. In one such embodiment, the ferroelectric material comprises a ferroelectric layer, and the negative-temperature-coefficient of capacitance material comprises another layer in direct, facing contact with the ferroelectric layer. In this case, the ferroelectric capacitor and the negative-temperature-variable capacitor are fabricated as an integral unit.

The electrical series connection may instead comprise a discrete electrical connection extending between the ferroelectric capacitor and the negative-temperature-variable capacitor. In this case, the ferroelectric capacitor and the negative-temperature-variable capacitor are fabricated separately and then linked in series with the electrical connection.

The ferroelectric material is preferably a metal oxide ferroelectric material, such as lead titanate, lead zirconate titanate, lead lanthanum zirconate titanate, barium titanate, strontium bismuth tantalate, strontium bismuth niobate, strontium bismuth tantalate niobate, or bismuth lead titanate. The presently most-preferred ferroelectric material is strontium bismuth tantalate niobate.

The negative-temperature-coefficient of capacitance material is preferably a paraelectric material. One such negative-temperature-coefficient-of-capacitance material is a metal oxide negative-temperature-coefficient-of-capacitance material, such as strontium titanate or barium strontium titanate. The presently most-preferred negative-temperature-coefficient-of-capacitance material is barium strontium titanate.

In a preferred structure, an integrated temperature-compensated capacitor device has ferroelectric properties and comprises a ferroelectric capacitor comprising a first electrode layer, and a ferroelectric layer of a ferroelectric material in direct physical contact with the first electrode layer. A negative-temperature-variable capacitor comprises a negative-temperature-variable layer of a negative-temperature-coefficient-of-capacitance material, such as a paraelectric material, in direct physical contact with the ferroelectric layer, and a second electrode layer in direct physical contact with the temperature-variable layer.

Such an integrated structure may be fabricated by providing a first electrode layer, depositing a ferroelectric precursor layer of a ferroelectric precursor material on the first electrode layer, reacting the ferroelectric precursor layer to produce a ferroelectric layer, depositing a temperature-variable precursor layer of a negative-temperature-coefficient-of-capacitance material on the ferroelectric layer, reacting the temperature-variable precursor layer to form a paraelectric layer, and placing a second electrode layer on the paraelectric layer. Compatible features discussed elsewhere herein may be used in relation to this fabrication procedure.

The temperature-compensated capacitor device takes advantage of the different temperature dependencies in ferroelectric and paraelectric materials so that the changes in permittivity and coercive voltage with temperature are greatly diminished, as compared with a conventional ferroelectric capacitor. The voltage across the temperature-compensated capacitor is divided across the ferroelectric capacitor and the negative-temperature-variable capacitor, in either the discrete or integrated embodiments as discussed herein.

The paraelectric (negative-temperature-variable) capacitor has a relatively high capacitance at the lower temperatures in the range of operation. Most of the voltage drop is therefore across the ferroelectric capacitor, and a normal ferroelectric hysteresis loop is observed. At higher temperatures within the operating temperature range, the paraelectric material has a lower permittivity so that the voltage drop is greater across the negative-temperature-variable capacitor relative to the ferroelectric capacitor. For small signal capacitance, the temperature-compensated capacitor device exhibits less variation over a selected temperature range than does the ferroelectric capacitor taken by itself. Regarding the hysteresis loop, the increased voltage across the paraelectric material at high temperature serves to compensate the decrease in coercive voltage for the ferroelectric material. Consequently, the change in performance as a function of temperature is less for the temperature-compensated capacitor device than for a conventional ferroelectric capacitor.

The present approach provides a capacitor device having ferroelectric properties which have a smaller dependence upon temperature than conventional ferroelectric capacitors. It may be used in any circuitry that requires a ferroelectric capacitor, such as those described in U.S. Pat. Nos. 5,729,488, 5,487,030, and 4,853,893, whose disclosures are incorporated by reference, and particularly those which are expected to experience variations in the operating temperature during their service lives. A memory device using this capacitor device may be utilized over an operating temperature range of from 25° C. to 125° C., for example. The need for associated temperature-compensation electronics is reduced, and in some cases eliminated.

The presence of the negative-temperature-variable capacitor in the temperature-compensated capacitor device results in a decrease in slope of the hysteresis loop at the coercive voltage, yielding improved performance for non-destructive read ferroelectric memories. For destructive-read memories, this slope change is of little consequence as long as the voltage applied is sufficient to saturate the polarization of the material.

Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

DETAILED DESCRIPTION OF THE INVENTION

Figure 1:
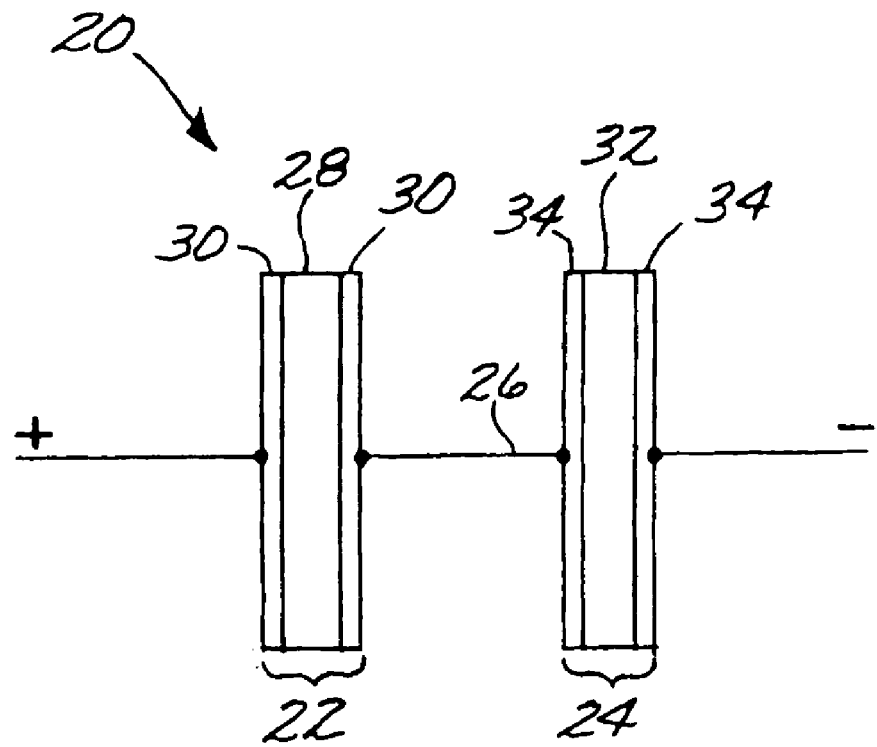
FIG. 1 is a schematic representation of a temperature-compensated ferroelectric capacitor device using discrete components.

FIG. 1 depicts one preferred embodiment of a temperature-compensated capacitor device 20 having ferroelectric properties. The temperature-compensated capacitor device 20 comprises a ferroelectric capacitor 22, a negative-temperature-variable capacitor 24, and an electrical series connection 26 between the negative-temperature-variable capacitor 24 and the ferroelectric capacitor 22. The ferroelectric capacitor 22 includes a ferroelectric layer 28 of a ferroelectric material, with electrodes 30 on either side of and contacting the ferroelectric layer 28. The negative-temperature-variable capacitor 24 includes a paraelectric layer 32 of a negative-temperature-coefficient-of-capacitance material, with electrodes 34 on either side of and contacting the paraelectric layer 32. The electrical series connection 26 extends between one of the electrodes 30 and one of the electrodes 34.

The temperature-compensated capacitor device 20 of FIG. 1 utilizes discrete capacitors 22 and 24, with the electrical series connection 26 in the form of a discrete electrical connection extending between the ferroelectric capacitor 22 and the negative-temperature-variable capacitor 24.

Figure 2:
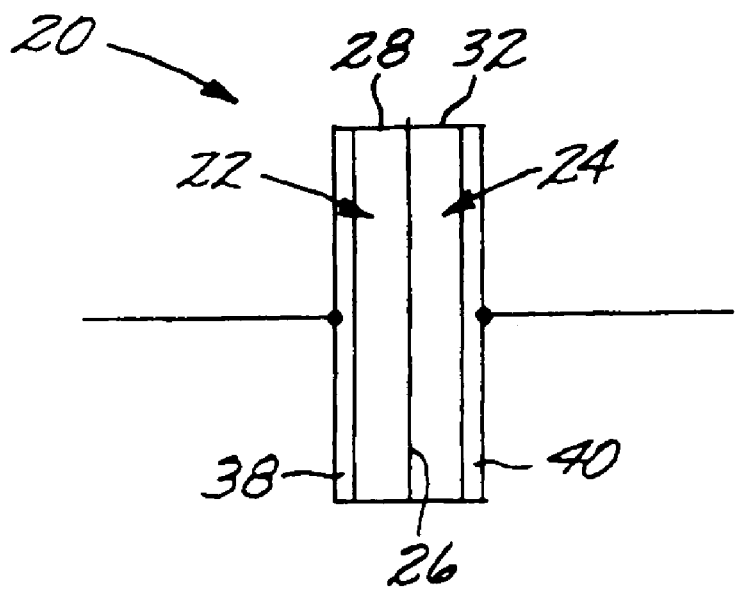
FIG. 2 is a schematic representation of an integrated temperature-compensated ferroelectric capacitor device.

An integrated embodiment is illustrated in FIG. 2, where the ferroelectric capacitor 22 and the negative-temperature-variable capacitor 24 are integrated into a single structure that forms the temperature-compensated capacitor device 20. The integrated embodiment of FIG. 2 is preferred to the discrete embodiment of FIG. 1 because of its compact structure, for those cases where the integrated embodiment of FIG. 2 may be manufactured.

In this integrated embodiment of FIG. 2, there is a direct physical contact between the ferroelectric capacitor 22 and the negative-temperature-variable capacitor 24. The ferroelectric material comprises the ferroelectric layer 28, and the negative-temperature-coefficient of capacitance material comprises the paraelectric layer 32 in direct, facing contact with the ferroelectric layer 28. That is, the direct, facing contact serves as the electrical series connection 26. A first electrode 38 and a second electrode 40 have the ferroelectric layer 28 and the contacting paraelectric layer 32 sandwiched therebetween. In a typical case, the ferroelectric layer 28 is from about 500 Angstroms to about 4000 Angstroms thick, and the paraelectric layer 32 is from about 75 Angstroms to about 3000 Angstroms thick. The electrodes 30, 38 and 40 may be made of a metal such as platinum, iridium, ruthenium, or palladium, or an electrically conductive nonmetal such as iridium oxide or ruthenium oxide.

The ferroelectric material of the ferroelectric layer 28 is preferably a metal oxide ferroelectric material such as lead titanate, lead zirconate titanate, lead lanthanum zirconate titanate, barium titanate, strontium bismuth tantalate, strontium bismuth niobate, strontium bismuth tantalate niobate, or bismuth lead titanate. Most preferably, the ferroelectric material is strontium bismuth tantalate niobate.

Figure 3:
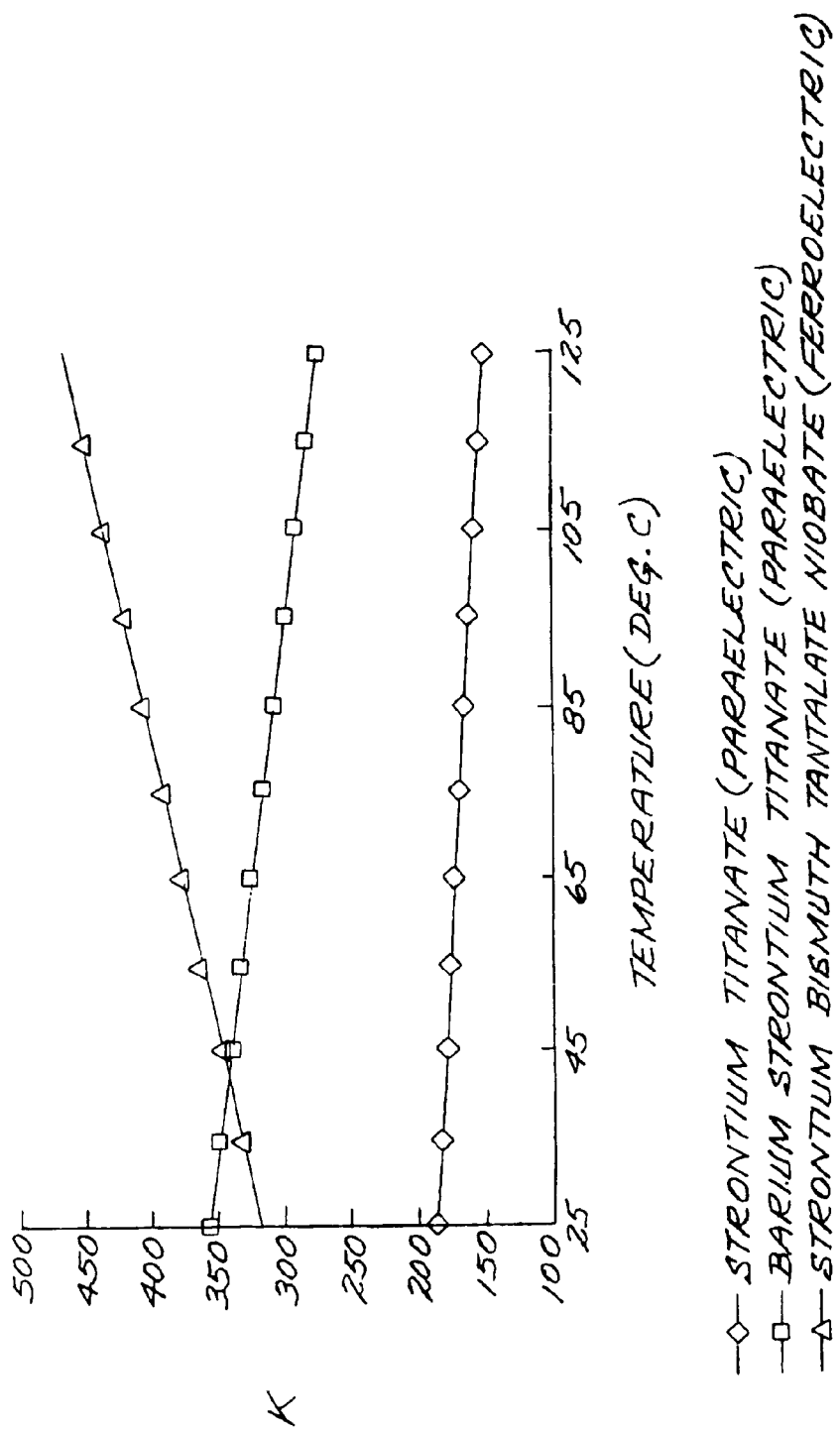
FIG. 3 is a graph of the relative permittivity change with temperature for ferroelectric and paraelectric materials.

For typical ferroelectric materials showing polarization/voltage hysteresis below the Curie temperature, the coercive voltage decreases and the permittivity increases as the temperature is increased toward the Curie temperature from lower temperatures. At the Curie temperature, the hysteresis diminishes to zero, and the permittivity approaches an infinite value. Above the Curie temperature, there is no hysteresis and the permittivity decreases, as expected for a paraelectric material. FIG. 3 illustrates properties of typical ferroelectric and paraelectric materials. The relative permittivity k of the ferroelectric materials typically increases strongly with temperature, and the relatively permittivity of the paraelectric materials typically decreases with increasing temperature.

Because of these variations, it is difficult to design a readout circuit that functions properly over a wide temperature range wherein the ferroelectric permittivity and coercive voltage change. This difficulty is particularly of concern where a non-destructive read ferroelectric memory relies on accurate control of the read voltage to be equal to the coercive voltage, to assure proper non-destructive read characteristics while detecting a small capacitance change in an environment where both the capacitor value and the coercive voltage are a function of temperature.

The negative-temperature-variable capacitor 24 therefore desirably exhibits decreased capacitance with increasing temperature over an operational temperature range. The negative-temperature-coefficient of capacitance material of the layer 32 is desirably a paraelectric material whose relative permittivity decreases with increasing temperature. The negative-temperature-coefficient of capacitance material is preferably a metal oxide negative-temperature-coefficient-of-capacitance material such as strontium titanate or barium strontium titanate, and is most preferably barium strontium titanate.

Figure 4:
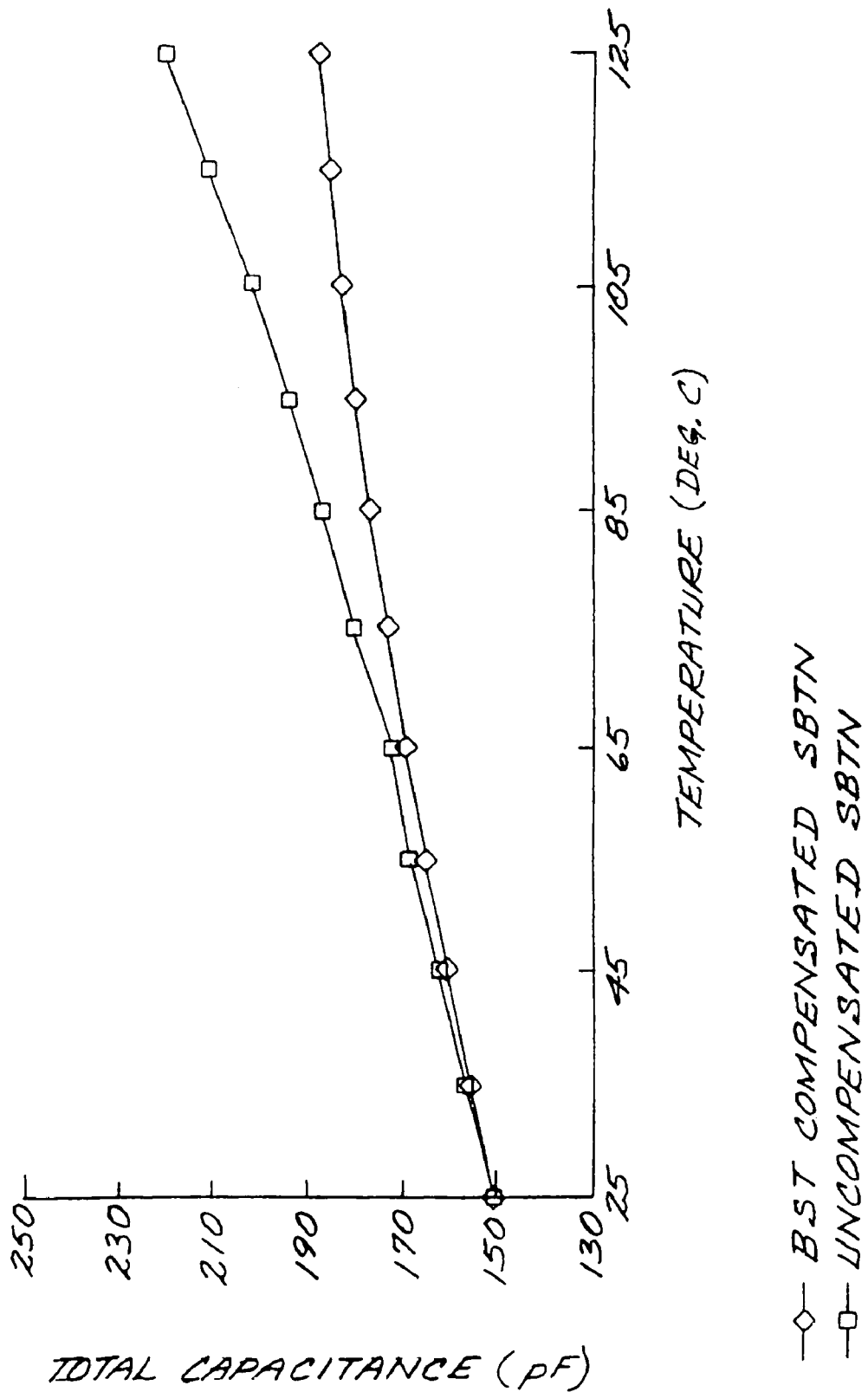
FIG. 4 presents calculated capacitor performance curves of an uncompensated and a compensated ferroelectric capacitor device.

FIG. 4 depicts the calculated capacitance of a conventional, uncompensated ferroelectric capacitor made of strontium bismuth tantalate niobate (SBTN), whose total capacitance increases sharply with temperature. Also shown in FIG. 4 are the similarly calculated properties of the temperature-compensated capacitance device 20 of the present invention over an operating temperature range of from 25° C. to 125° C., utilizing an SBTN ferroelectric layer 28 and a $Ba_{0.5}Sr_{0.5}TiO_3$ (BST) paraelectric layer 32. The temperature-compensated capacitance device 20 exhibits some temperature dependence of the total capacitance, but substantially less than that of the uncompensated ferroelectric capacitor. If only the small signal capacitance is of interest, the total capacitance of the temperature-compensated capacitor device 20 may be made to be nearly temperature invariant.

Figure 5:
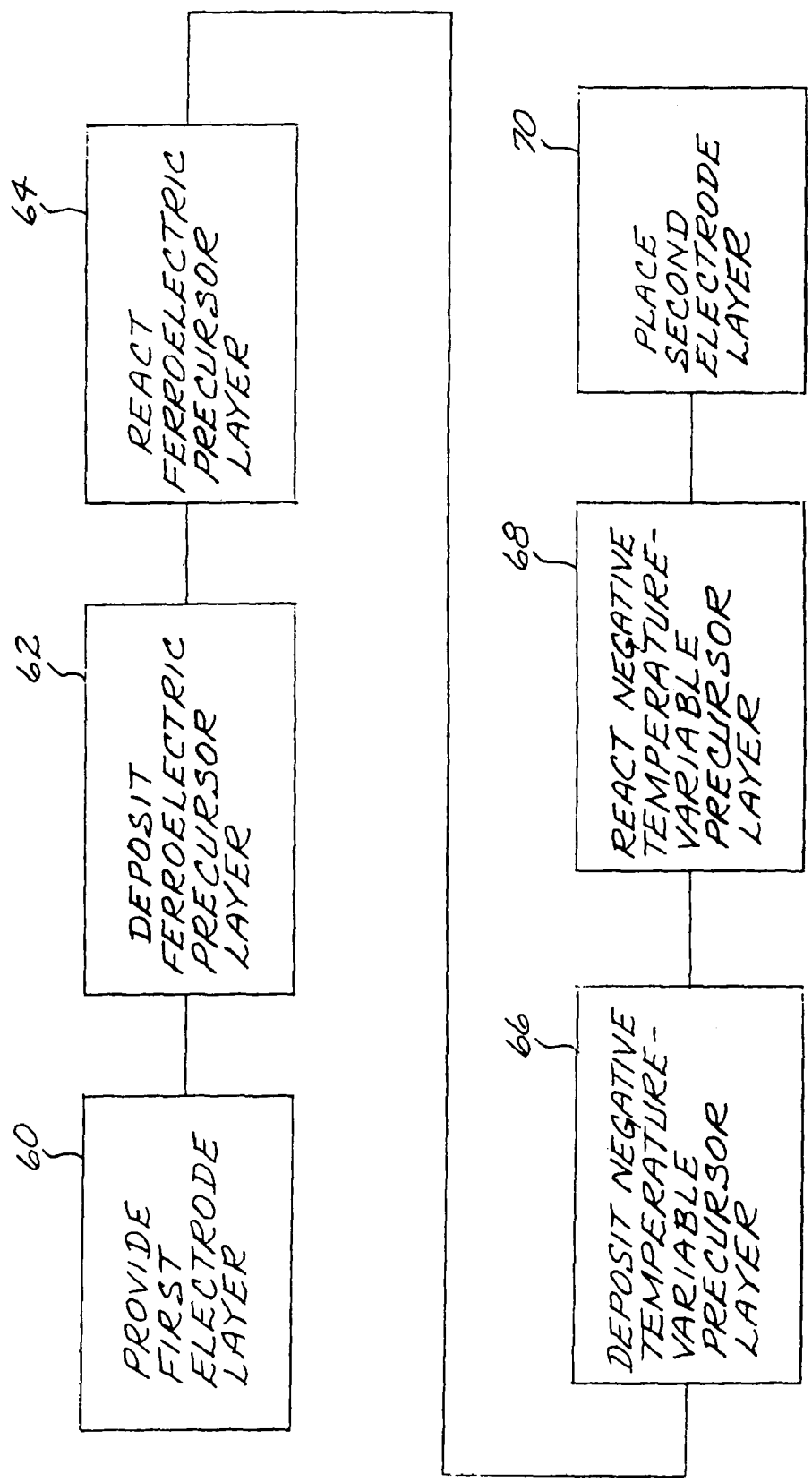
FIG. 5 is a block diagram of a preferred approach for fabricating the temperature-compensated ferroelectric capacitor device.

FIG. 5 illustrates a preferred approach for practicing the invention to make the preferred embodiment of the temperature-compensated capacitance device 20 shown in FIG. 2. The first electrode 38 in the form of the first electrode layer is provided, step 60. The first electrode 38 may be of any operable material, and may be provided by any operable approach. The first electrode 38 is desirably a platinum electrode deposited upon a substrate by vacuum evaporation of the platinum, and then thermally annealed at a temperature of about 700° C. to stabilize the first electrode 38.

A ferroelectric precursor layer of a ferroelectric precursor material is deposited on the first electrode layer, step 62. In the preferred approach, a liquid solution of the metal oxide ferroelectric precursor material is prepared and then spun onto the first electrode layer. In the preferred case, the metal-2-ethylhexanoate salts of strontium, bismuth, tantalum, and niobium are dissolved in a solvent of xylene and n-butylacetate. In the preferred case, the atomic ratio of strontium: bismuth:tantalum:niobium is 0.9:2.18:1.5:0.5. The resulting ferroelectric precursor solution is spun onto the first electrode layer in one or more steps to achieve the desired thickness, with drying between each spin-on step. The ferroelectric precursor layer is reacted, step 64, by crystallizing in a rapid thermal processor and then sintering in a tube furnace to form the ferroelectric material of the ferroelectric layer 28. In this case, the crystallizing is performed at a temperature of about 725° C., and the sintering is performed at a temperature of about 700° C.

A negative-temperature-variable precursor layer of a negative-temperature-coefficient of capacitance material is deposited on the ferroelectric layer 28, step 66. In the preferred approach, the temperature-precursor material is a mixture of the metal-2-ethylhexanoate salts of strontium, barium, and titanium, dissolved in the solvent of xylene and n-butylacetate. In the preferred case, the atomic ratio of strontium: barium:titanium is 0.5:0.5:1.05. The resulting temperature-variable precursor solution is spun onto the ferroelectric layer 28 in one or more steps to achieve the desired thickness, with drying between each spin-on step. The temperature-variable precursor layer is reacted, step 68, by crystallizing in a rapid thermal processor and thereafter sintering in a tube furnace to form the ferroelectric material of the paraelectric layer 32. In this case, the crystallizing is performed at a temperature of about 725° C., and the sintering is performed at a temperature of 700° C.

The second electrode 40 in the form of a second electrode layer is placed on the paraelectric layer 32, step 70. The second electrode 40 is preferably deposited in the manner described for the first electrode 38.

A temperature-compensated capacitor device 20 as discussed above in the form illustrated in relation to FIG. 2 was prepared as described in relation to FIG. 5. The resulting temperature-compensated capacitor device functioned as described above.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A method comprising the steps of:
    providing a memory device operable to store and retrieve information;
    providing a temperature-compensated capacitor device incorporated into the memory device, the temperature-compensated capacitor device including
        a ferroelectric capacitor comprising a ferroelectric material,
        a negative-temperature-variable capacitor comprising a negative-temperature-coefficient-of-capacitance material, the negative-temperature-variable capacitor having a capacitance that decreases with increasing temperature over an operating range of from 25° C. to 125° C., the negative-temperature-variable capacitor matched to the ferroelectric capacitor such that a combined capacitance of the temperature-compensated capacitor device remains generally temperature invariant over the operating temperature range of from 25° C. to 125° C., and
    an electrical series connection between the negative-temperature-variable capacitor and the ferroelectric capacitor.

2. The method of claim 1, wherein the electrical series connection comprises a direct physical contact between the ferroelectric capacitor and the negative-temperature-variable capacitor.

3. The method of claim 1, wherein the electrical series connection comprises a discrete electrical connection extending between the ferroelectric capacitor and the negative-temperature-variable capacitor.

4. The method of claim 1, wherein the negative-temperature-coefficient-of-capacitance material is in direct, facing contact with the ferroelectric material.

5. The method of claim 1, wherein the ferroelectric material is a metal oxide ferroelectric material.

6. The method of claim 1, wherein the ferroelectric material is a metal oxide ferroelectric material selected from the group consisting of lead titanate, lead zirconate titanate, lead lanthanum zirconate titanate, barium titanate, strontium bismuth tantalate, strontium bismuth niobate, strontium bismuth tantalate niobate, and bismuth lead titanate.

7. The method of claim 1 wherein the negative-temperature-coefficient-of-capacitance material is a paraelectric material.

8. The method of claim 1, wherein the negative-temperature-coefficient-of-capacitance material is a metal oxide negative-temperature-coefficient-of-capacitance material.

9. The method of claim 1, wherein the negative-temperature-coefficient-of-capacitance material is a metal oxide negative-temperature-coefficient-of-capacitance material selected from the group consisting of strontium titanate and barium strontium titanate.

10. The method of claim 1, wherein the negative-temperature-coefficient-of-capacitance material is barium strontium titanate.

11. The method of claim 1, wherein the memory device is operable over an operating temperature range of from 25° C. to 125° C.

12. The method of claim 1, wherein the ferroelectric material is strontium bismuth tantalate niobate and the negative-temperature-coefficient-of-capacitance material is barium strontium titanate.

13. A method comprising the steps of:
providing a memory device operable to store and retrieve information;
providing a temperature-compensated capacitor device incorporated into the memory device, the temperature-compensated capacitor device including
a ferroelectric capacitor comprising a ferroelectric material, wherein the ferroelectric material is a metal oxide ferroelectric material selected from the group consisting of lead titanate, lead zirconate titanate, lead lanthanum zirconate titanate, barium titanate, strontium bismuth tantalate, strontium bismuth niobate, strontium bismuth tantalate niobate, and bismuth lead titanate,
a negative-temperature-variable capacitor comprising barium strontium titanate negative-temperature-coefficient-of-capacitance material, the negative-temperature-variable capacitor having a capacitance that decreases with increasing temperature over an operating range of from 25° C. to 125° C., the negative-temperature-variable capacitor matched to the ferroelectric capacitor such that a combined capacitance of the temperature-compensated capacitor device remains generally temperature invariant over the operating temperature range of from 25° C. to 125° C., and
an electrical series connection between the negative-temperature-variable capacitor and the ferroelectric capacitor.

14. The method of claim 13, wherein the electrical series connection comprises a direct physical contact between the ferroelectric capacitor and the negative-temperature-variable capacitor.

15. The method of claim 13, wherein the the memory device is operable over an operating temperature range of from 25° C. to 125° C.

16. The method of claim 13, wherein the ferroelectric material is strontium bismuth tantalate niobate.

17. A method comprising the steps of:
providing a memory device operable to store and retrieve information;
providing a temperature-compensated capacitor device incorporated into the memory device, the temperature-compensated capacitor device including
a ferroelectric capacitor comprising a ferroelectric material, wherein the ferroelectric material is a metal oxide ferroelectric material selected from the group consisting of lead titanate, lead zirconate titanate, lead lanthanum zirconate titanate, barium titanate, strontium bismuth tantalate, strontium bismuth niobate, strontium bismuth tantalate niobate, and bismuth lead titanate,
a negative-temperature-variable capacitor comprising barium strontium titanate negative-temperature-coefficient-of-capacitance material, the negative-temperature-variable capacitor having a capacitance that decreases with increasing temperature over an operating range of from 25° C. to 125° C., the negative-temperature-variable capacitor matched to the ferroelectric capacitor such that a combined capacitance of the temperature-compensated capacitor device remains generally temperature invariant over the operating temperature range of from 25° C. to 125° C., and
an electrical series connection between the negative-temperature-variable capacitor and the ferroelectric capacitor, wherein the electrical series connection comprises a discrete electrical connection extending between the ferroelectric capacitor and the negative-temperature-variable capacitor.

18. A method comprising the steps of:
fabricating the temperature-compensated capacitor by
providing a first electrode layer,
depositing a ferroelectric precursor layer of a ferroelectric precursor material on the first electrode layer,
reacting the ferroelectric precursor layer to produce a ferroelectric layer,
depositing a negative-temperature-variable precursor layer of a negative-temperature-coefficient-of-capacitance material on the ferroelectric layer,
reacting the negative-temperature-variable precursor layer to form a paraelectric layer, the paraelectric layer having a capacitance that decreases with increasing temperature over an operating range of from 25° C. to 125° C., the paraelectric layer matched to the ferroelectric layer such that a combined capacitance of the temperature-compensated capacitor remains generally temperature invariant over the operating temperature range of from 25° C. to 125° C., wherein the ferroelectric layer comprises strontium bismuth tantalate niobate and the paralectric layer comprises barium strontium titanate,
placing a second electrode layer on the paraelectric layer, and
operably electrically connecting a memory readout circuit to the ferroelectric layer and to the paraelectric layer; and
incorporating the temperature-compensated capacitor in a memory device operable to store and retrieve information over an operating temperature range.

19. The method of claim 18, wherein the step of providing the first electrode layer includes the step of
depositing the first electrode layer, and
wherein the step of placing a second electrode layer includes the step of depositing the second electrode layer.

20. The method of claim 18, wherein the step of depositing the ferroelectric precursor layer includes the step of
depositing a precursor of a metal oxide ferroelectric material.

21. The method of claim 18, wherein the step of depositing the temperature-variable precursor layer includes the step of
depositing a precursor of a metal oxide negative-temperature-coefficient-of-capacitance material.

22. The method of claim 18, wherein the memory device is operable over an operating temperature range of from 25° C. to 125° C.

* * * * *